United States Patent
Rusch et al.

(10) Patent No.: US 6,774,456 B2
(45) Date of Patent: Aug. 10, 2004

(54) CONFIGURATION OF FUSES IN SEMICONDUCTOR STRUCTURES WITH CU METALLIZATION

(75) Inventors: Andreas Rusch, München (DE); Jens Moeckel, München (DE)

(73) Assignee: Infineon Technologies AG, Munich (DE)

(*) Notice: Subject to any disclaimer, the term of this patent is extended or adjusted under 35 U.S.C. 154(b) by 92 days.

(21) Appl. No.: 10/013,256

(22) Filed: Dec. 10, 2001

(65) Prior Publication Data

US 2002/0100957 A1 Aug. 1, 2002

Related U.S. Application Data

(63) Continuation of application No. PCT/DE00/01897, filed on Jun. 9, 2000.

(30) Foreign Application Priority Data

Jun. 10, 1999 (DE) .......................................... 199 26 499

(51) Int. Cl.[7] .......................................... H01L 21/425
(52) U.S. Cl. ...................... 257/529; 257/173; 257/665; 257/910; 257/530; 257/784; 257/781; 257/773; 257/677; 257/690; 438/132; 438/215; 438/281; 438/333; 438/467; 438/601
(58) Field of Search ................... 257/784, 781, 257/773, 677, 690, 529, 173, 665, 910, 530; 438/132, 215, 281, 333, 467, 601

(56) References Cited

U.S. PATENT DOCUMENTS

| | | | |
|---|---|---|---|
| 5,102,506 A | | 4/1992 | Tanielian et al. |
| 5,430,258 A | | 7/1995 | Hoshino |
| 5,465,004 A | | 11/1995 | Lim et al. |
| 5,550,399 A | * | 8/1996 | Okazaki ...................... 257/529 |
| 5,592,024 A | | 1/1997 | Aoyama et al. |
| 5,663,590 A | | 9/1997 | Kapoor |
| 5,731,624 A | | 3/1998 | Motsiff et al. |
| 6,249,038 B1 | * | 6/2001 | Daubenspeck et al. ..... 257/529 |

FOREIGN PATENT DOCUMENTS

EP        0 913 863 A2    5/1999

* cited by examiner

*Primary Examiner*—Eddie Lee
*Assistant Examiner*—Junghwa Im
(74) *Attorney, Agent, or Firm*—Laurence A. Greenberg; Werner H. Stemer; Ralph E. Locher

(57) ABSTRACT

A configuration of fuses in a semiconductor structure having Cu metallization planes is provided. The semiconductor structure has an Al metal layer on the topmost interconnect plane for providing Al bonding pads. The fuses are configured as Al fuses and, in the semiconductor structure having Cu metallization planes, are provided above the diffusion barrier of the topmost Cu metallization plane but below a passivation layer.

9 Claims, 1 Drawing Sheet

CONFIGURATION OF FUSES IN SEMICONDUCTOR STRUCTURES WITH CU METALLIZATION

CROSS-REFERENCE TO RELATED APPLICATION:

This application is a continuation of copending International Application No. PCT/DE00/01897, filed Jun. 9, 2000, which designated the United States.

BACKGROUND OF THE INVENTION

Field of the Invention:

The invention relates to a configuration of fuses in semiconductor structures having a Cu metallization, in particular for DRAMs (Dynamic Random Access Memories), logic components and eDRAMs (erasable Dynamic Random Access Memories). The semiconductor structures include Cu metallization planes which are surrounded by a diffusion barrier layer wherein a metal layer for providing bonding pads is provided on the topmost interconnect plane and wherein the metal layer is covered with a passivation layer.

So-called fuses are used in many semiconductor components; in most cases, fuses are provided horizontally and are used, for example, to enable a subsequent functional selection and/or adaptation of the semiconductor component. Fuses of this type include conductive tracks, e.g. made of polysilicon, or aluminum, and are usually severed in a targeted manner with the aid of a laser. These fuses are used in particular in DRAM, Logic and eDRAM components.

According to the current prior art, all of the metallization planes are fabricated from aluminum, or in part also from platinum, gold, or else tungsten and/or polysilicon, i.e. all of the interconnects, through-contacts and also the bonding pads include these materials, or alloys thereof, as disclosed for example in U.S. Pat. No. 5,663,590. These technologies are a mature and reliable technology whose problem points are reliably controlled. However, the Al technology imposes limits with regard to the structure widths that can be realized and the current-carrying capacity, i.e. the integration density that has currently been reached can scarcely be increased any further with the aid of the Al technology.

For this reason, it is noticeable that there is increasingly a transition to Cu technology, in which all of the metallization planes are produced from Cu. The aluminum is thus entirely replaced by copper, which has the particular advantage that either higher current densities or significantly smaller structure widths can be realized. An example of the new Cu technology is disclosed in U.S. Pat. No. 5,731,624.

What may be regarded as disadvantageous in the use of copper for the metallization is that it is necessary to provide additional diffusion barriers or passivation layers. What are critical for the transition to Cu metallization are the better performance, the higher current-carrying capacity and the lower costs.

The following particular problems make it more difficult to use copper for the metallization. By way of example, there are no Al interconnects whatsoever available for fuses. In principle, the fuses can, of course, also be produced from Cu, but this is significantly more critical than in the case of fuses made of other materials. Thus, Cu readily corrodes under the action of moisture and must therefore be covered by a special protective layer. However, since fuses are opened through the use of a laser or else electrically, the additional covering makes the fuse process more difficult. Moreover, any slight uniformity causes, in places, a comparatively thick passivation layer which can make it impossible to open the fuses.

A further problem can be seen in the fact that the fuses that are opened through the use of a laser or else the electrically opened fuses have exposed cut edges which can easily corrode. Furthermore, the melting point of copper (1083° C.) is significantly above the melting point of other conductive materials used in semiconductor technology (e.g. Al 660° C.). Thermal fuse processes (electrical or using a laser) are made considerably more difficult as a result of this, since the high energy required to open the Cu fuses can lead to damage to the underlying layers through to damage to the substrate.

Due to the high melting point and the oxide covering, it is necessary for laser-processed Cu fuses to be processed a number of times, if appropriate, in order to achieve the high fuse residual resistance required, which considerably reduces the plant throughput.

SUMMARY OF THE INVENTION

It is accordingly an object of the invention to provide a fuse configuration which overcomes the above-mentioned disadvantages of the heretofore-known configurations of this general type and which allows the realization of fuses that can be handled without difficulty whilst retaining all the process steps of Cu technology.

With the foregoing and other objects in view there is provided, in accordance with the invention, a fuse configuration, including:

a semiconductor structure having Cu metallization planes including a topmost Cu metallization plane;
a diffusion barrier layer surrounding at least the topmost Cu metallization plane;
an Al metal layer configured to provide Al bonding pads, the Al metal layer being provided in a topmost interconnect plane;
a passivation layer covering the Al metal layer;
through-contacts extending through the diffusion barrier layer;
at least two Al interconnects connected to the topmost Cu metallization plane via the through-contacts; and
Al fuses disposed above the diffusion barrier layer but below the passivation layer, the Al fuses connecting the at least two Al interconnects to one another.

In other words, the object of the invention is achieved by virtue of the fact that the metal layer is an Al metal layer for providing Al bonding pads, that the fuses are configured as Al fuses, that the Al fuses are provided above the diffusion barrier layer of the topmost Cu metallization plane and below the passivation layer, and that the Al fuses connected at least two Al interconnects to one another, which are connected to the topmost Cu metallization plane via through-contacts running through the diffusion barrier layer.

The invention completely eliminates the problems that otherwise accompany Cu technology with respect to the separation of Cu fuses. In particular, the advantages of Al fuses, such as low melting point and the known technology, can also be utilized in the case of Cu technology. It is not necessary to alter or adapt the technology.

The Al fuses are preferably provided in the plane of the metallization for the bonding pads. As a result, no additional technological steps whatsoever are necessary for fabricating the Al fuses, the metal layer for the bonding pads being able to be fabricated from Al or a metal sandwich. In particular, the configurations of the Al fuses in the bonding pad plane has the particular advantage that, photolithographically, only a small resolution is required on account of the comparatively large structure size of the bonding pads.

The Al metallization layer is provided with Al interconnects which are electrically connected to the respective topmost Cu plane via through-contacts, and the Al fuses are part of the interconnects.

According to another feature of the invention, the metal layer for the bonding pads consists substantially only of Al or is a metal sandwich.

According to another feature of the invention, the Al metal layer is provided with Al interconnects, and the Al fuses are part of the Al interconnects.

In order that the Al fuses can be opened particularly easily, openings are introduced above the Al fuses within the passivation layer, which openings keep the Al fuses free.

The Al fuses are configured as bridges which electrically connect individual interconnects of the topmost Cu metallization plane to one another.

The Al fuses may also be configured as bridges which connect individual bonding pads to one another.

With the objects of the invention in view there is also provided, a semiconductor component, including:

a semiconductor configuration selected from the group consisting of a DRAM, a logic component and an eDRAM; and the semiconductor configuration including a fuse configuration having a semiconductor structure with Cu metallization planes including a topmost Cu metallization plane, a diffusion barrier layer surrounding at least the topmost Cu metallization plane, an Al metal layer configured to provide Al bonding pads, the Al metal layer being provided in a topmost interconnect plane, a passivation layer covering the Al metal layer, through-contacts extending through the diffusion barrier layer, at least two Al interconnects connected to the topmost Cu metallization plane via the through-contacts, and Al fuses disposed above the diffusion barrier layer but below the passivation layer, the Al fuses connecting the at least two Al interconnects to one another.

Other features which are considered as characteristic for the invention are set forth in the appended claims.

Although the invention is illustrated and described herein as embodied in a configuration of fuses in semiconductor structures with Cu metallization, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
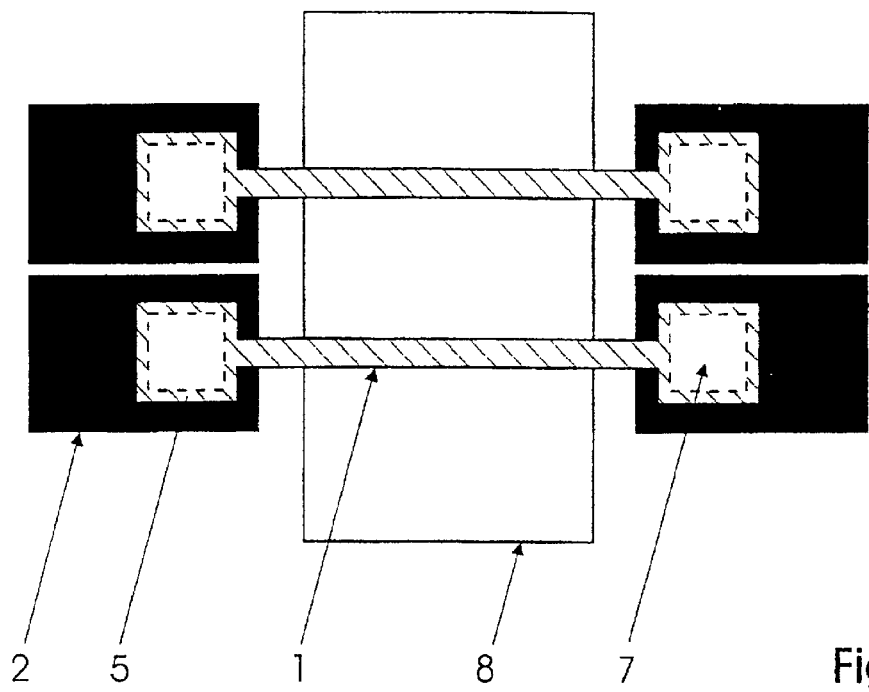
FIG. 1 is a diagrammatic plan view of a semiconductor component fabricated using Cu technology with Al fuses provided according to the invention.
Figure 2:
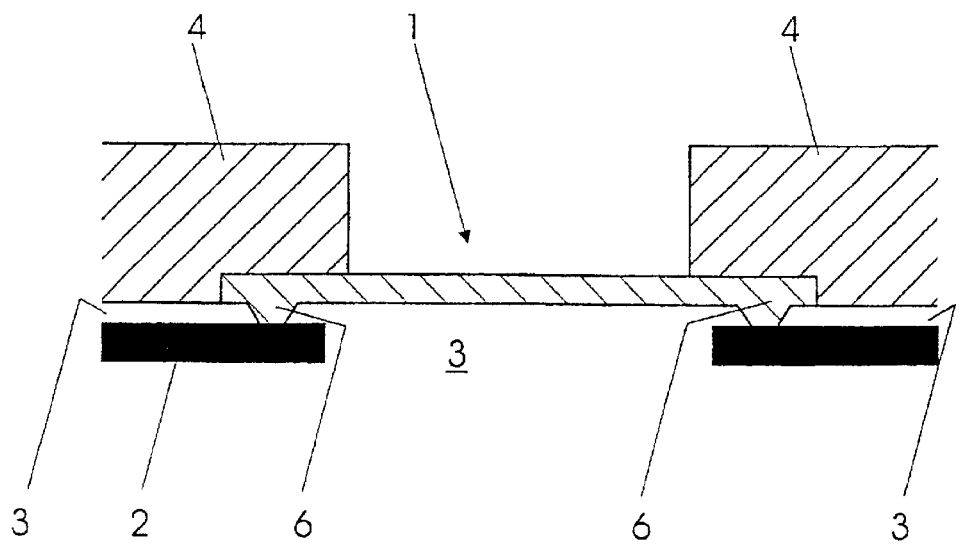
FIG. 2 is a diagrammatic sectional view of the configuration according to FIG. 1.

Referring now to the figures of the drawings in detail and first, particularly, to FIG. 1 thereof, there is shown a configuration of Al fuses 1 that is particularly simple to realize in the case of a semiconductor component fabricated with a Cu metallization 2. In this case, the basis for the realization of the Al fuses 1 is formed by the topmost Cu metallization layer 2, which is embedded in an oxide/nitride layer 3, which serves as diffusion barrier and on which, as usual, a passivation layer 4 is provided.

An Al metallization plane for the realization of interconnects 5 is inserted between the passivation layer 4 and the oxide/nitride layer 3. The interconnects 5 are connected via through-contacts 6 to the deeper interconnects of the Cu metallization 2. Furthermore, above the Cu interconnects there are openings 7 in the passivation layer 4 for the through-contacts.

As can furthermore be seen from the figures of the drawings, individual interconnects 5 are connected to one another by Al fuses 1, above which a large-area opening 8 is introduced into the passivation layer 4. As a result, the Al fuses 1 can be opened through the use of a laser or electrically, as required, without any difficulty. Due to the comparatively low melting point of aluminum, it need not be feared that there will be any damage whatsoever to functional layers lying below the Al fuses 1.

The particular advantage of the configuration of the Al fuses according to the invention can be seen in the fact that the simple handling of the fuses can now also be transferred to those semiconductor components which have pure Cu metallization. Furthermore, on account of the comparatively large structure of the bonding pads, the configuration of the Al fuses in the bonding pad plane imposes only minor requirements on the photo-lithographic process, since only a small resolution is required.

We claim:

1. A fuse configuration, comprising:

a semiconductor structure having Cu metallization planes including a topmost Cu metallization plane;

a diffusion barrier layer surrounding at least said topmost Cu metallization plane;

an Al metal layer configured to provide Al bonding pads, said Al metal layer being provided in a topmost interconnect plane;

a passivation layer covering said Al metal layer;

through-contacts on said Al bonding pads extending through said diffusion barrier layer;

an interconnect connected between said Al bonding pads; and wherein said interconnect is a fuse disposed above said diffusion barrier layer but below said passivation layer.

2. The configuration according to claim 1, wherein said Al bonding pads define a metallization plane and said Al fuse is provided in said metallization plane of said Al bonding pads.

3. The configuration according to claim 1, wherein said Al metal layer configured to provide said Al bonding pads consists of substantially only aluminum.

4. The configuration according to claim 1, wherein said Al metal layer configured to provide said Al bonding pads is a metal sandwich layer.

5. The configuration according to claim 1, wherein said Al metal layer includes Al interconnect and said Al fuse are part of said Al interconnects.

6. The configuration according to claim 1, wherein said passivation layer has openings formed therein, said openings are formed above said Al fuse for keeping said Al fuse exposed.

7. The configuration according to claim 1, wherein said topmost Cu metallization plane includes interconnects, said Al fuse are configured as bridges and electrically connect said interconnects of said topmost Cu metallization plane to one another.

8. The configuration according to claim 1, wherein said Al fuse is configured as bridges connecting given ones of said Al bonding pads to one another.

9. A semiconductor component, comprising:
- a semiconductor configuration selected from the group consisting of a DRAM, a logic component and an eDRAM; and
- said semiconductor configuration including a fuse configuration having a semiconductor structure with Cu metallization planes including a topmost Cu metallization plane, a diffusion barrier layer surrounding at least said topmost Cu metallization plane, an Al metal layer configured to provide Al bonding pads, said Al metal layer being provided in a topmost interconnect plane, a passivation layer covering said Al metal layer, through-contacts on said bonding pads extending through said diffusion barrier layer, an interconnect connected between said bonding pads, and wherein said interconnect is a fuse disposed above said diffusion barrier layer but below said passivation layer.

* * * * *